(12) United States Patent
Han et al.

(10) Patent No.: US 9,553,069 B2
(45) Date of Patent: Jan. 24, 2017

(54) BONDING APPARATUS AND SUBSTRATE MANUFACTURING EQUIPMENT INCLUDING THE SAME

(71) Applicant: SAMSUNG ELECTRONICS CO., LTD., Suwon-si, Gyeonggi-Do (KR)

(72) Inventors: Ilyoung Han, Uiwang-si (KR); Kyoungran Kim, Suwon-si (KR); Donggil Shim, Bucheon-si (KR); Geunsik Oh, Hwaseong-si (KR); Youngjoo Lee, Seoul (KR); Junho Lee, Yongin-si (KR); Sukwon Lee, Yongin-si (KR)

(73) Assignee: Samsung Electronics Co., Ltd., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/852,825

(22) Filed: Sep. 14, 2015

(65) Prior Publication Data

US 2016/0118362 A1   Apr. 28, 2016

(30) Foreign Application Priority Data

Oct. 23, 2014   (KR) .................. 10-2014-0144437

(51) Int. Cl.
*B23K 37/04*   (2006.01)
*H01L 23/00*   (2006.01)
*B23K 3/08*   (2006.01)

(52) U.S. Cl.
CPC ............. *H01L 24/75* (2013.01); *B23K 3/087* (2013.01); *B23K 37/04* (2013.01); *H01L 2224/7598* (2013.01); *H01L 2224/75252* (2013.01); *H01L 2224/75704* (2013.01); *H01L 2224/75705* (2013.01)

(58) Field of Classification Search
CPC .......... B23K 1/0016; B23K 2201/36–2201/42; B23K 37/04–37/047; B23K 3/087; H01L 24/75; H01L 2224/7598; H01L 2224/75705; H01L 2224/75704; H01L 2224/75252
USPC ...... 228/6.2, 179.1–180.22, 47.1, 49.1, 49.5, 228/44.3, 44.7, 4.1, 5.5
See application file for complete search history.

(56) References Cited

U.S. PATENT DOCUMENTS

| | | | | |
|---|---|---|---|---|
| 3,918,146 A | * | 11/1975 | Hartleroad | ........ H01L 21/67144 228/6.2 |
| 3,937,386 A | * | 2/1976 | Hartleroad | ............. B82Y 15/00 228/180.21 |
| 4,607,779 A | | 8/1986 | Burns | |
| 5,082,165 A | * | 1/1992 | Ishizuka | ................ B65G 25/02 228/179.1 |
| 5,372,292 A | * | 12/1994 | Sato | ........................ B23K 20/02 228/44.7 |

(Continued)

FOREIGN PATENT DOCUMENTS

JP   05192792 A   *   8/1993
JP   09097813 A   *   4/1997

(Continued)

*Primary Examiner* — Kiley Stoner
(74) *Attorney, Agent, or Firm* — Volentine & Whitt, PLLC

(57) ABSTRACT

A bonding apparatus of substrate manufacturing equipment includes an upper stage, a lower stage facing the upper stage and which is configure and dedicated to support a processed substrate on which semiconductor chips are stacked (set), and an elevating mechanism for raising the lower stage relative to the upper stage to provide pressure for pressing the substrate and chips towards each other.

19 Claims, 17 Drawing Sheets

(56) References Cited

U.S. PATENT DOCUMENTS

| | | | | |
|---|---|---|---|---|
| 5,603,446 | A * | 2/1997 | Kikuchi | B23K 20/004 228/44.7 |
| 5,628,660 | A * | 5/1997 | Onitsuka | H05K 13/0408 228/105 |
| 5,682,675 | A * | 11/1997 | Hirota | H01R 43/205 228/180.21 |
| 6,114,711 | A * | 9/2000 | Stavrides | B23Q 17/24 250/559.29 |
| 6,164,514 | A * | 12/2000 | Miller | B23K 20/10 228/1.1 |
| 6,201,306 | B1 * | 3/2001 | Kurosawa | H01L 21/67144 228/102 |
| 6,320,372 | B1 * | 11/2001 | Keller | G01R 31/2887 324/756.05 |
| 6,471,110 | B1 * | 10/2002 | Luechinger | B23K 3/08 228/102 |
| 6,494,358 | B2 * | 12/2002 | Narita | H01L 21/67138 228/41 |
| 6,670,818 | B1 | 12/2003 | Hembree | |
| 6,702,173 | B2 * | 3/2004 | Murakami | B41F 19/068 228/39 |
| 6,774,651 | B1 | 8/2004 | Hembree | |
| 6,779,703 | B2 * | 8/2004 | Matsumoto | B21D 22/10 228/5.5 |
| 6,861,614 | B1 * | 3/2005 | Tanabe | B23K 26/04 219/121.66 |
| 6,889,427 | B2 * | 5/2005 | Yee | H01L 21/67092 156/361 |
| 6,897,963 | B1 | 5/2005 | Taniguchi et al. | |
| 7,491,625 | B2 | 2/2009 | Bayan et al. | |
| 7,579,848 | B2 | 8/2009 | Bottoms et al. | |
| 7,861,913 | B2 * | 1/2011 | Miyazaki | H01L 24/75 156/311 |
| 8,023,106 | B2 * | 9/2011 | Shibazaki | G03F 7/70775 355/53 |
| 8,348,252 | B2 | 1/2013 | Di Stefano et al. | |
| 8,665,455 | B2 * | 3/2014 | Kanaya | G03F 7/70775 355/53 |
| 8,833,418 | B2 | 9/2014 | Or | |
| 8,899,289 | B2 * | 12/2014 | Deguchi | B32B 38/0036 156/349 |
| 2002/0117267 | A1 * | 8/2002 | Ogawa | H01L 21/67092 156/581 |
| 2003/0178467 | A1 * | 9/2003 | Lee | B23K 1/0016 228/42 |
| 2003/0178468 | A1 * | 9/2003 | Lee | G02F 1/1333 228/102 |
| 2005/0061856 | A1 * | 3/2005 | Maki | H01L 21/561 228/234.1 |
| 2005/0252947 | A1 * | 11/2005 | Fujii | B23K 20/122 228/112.1 |
| 2006/0065967 | A1 * | 3/2006 | Lehner | H01L 21/6835 257/698 |
| 2006/0243391 | A1 * | 11/2006 | Onituka | H05K 13/00 156/358 |
| 2006/0273450 | A1 * | 12/2006 | Shi | B23K 20/023 257/706 |
| 2007/0020801 | A1 * | 1/2007 | Ishikawa | G06K 19/07718 438/106 |
| 2007/0105459 | A1 * | 5/2007 | Aruga | B23K 20/023 439/894 |
| 2007/0275544 | A1 * | 11/2007 | Maki | H01L 21/67092 438/464 |
| 2008/0087178 | A1 * | 4/2008 | Jo | H05K 3/1216 101/129 |
| 2008/0104831 | A1 * | 5/2008 | Haji | H01L 21/67132 29/833 |
| 2008/0318346 | A1 * | 12/2008 | Maki | H01L 21/67132 438/7 |
| 2010/0024667 | A1 * | 2/2010 | Ikura | B30B 15/067 100/38 |
| 2010/0243153 | A1 * | 9/2010 | Onitsuka | H01L 21/67 156/290 |
| 2010/0252167 | A1 * | 10/2010 | Ferrari | B23K 1/0008 156/60 |
| 2010/0327043 | A1 * | 12/2010 | Nakamura | H01L 21/563 228/44.3 |
| 2011/0179638 | A1 * | 7/2011 | Nagao | B23K 1/0016 29/729 |
| 2012/0091186 | A1 * | 4/2012 | Akiyama | H01L 21/67092 228/44.3 |
| 2012/0091187 | A1 * | 4/2012 | Akiyama | H01L 21/67092 228/221 |
| 2012/0210554 | A1 * | 8/2012 | Han | H01L 24/75 29/428 |
| 2012/0247664 | A1 * | 10/2012 | Kobayashi | H01L 24/75 156/285 |
| 2013/0215206 | A1 * | 8/2013 | Matsuhashi | B41J 3/407 347/105 |
| 2013/0272837 | A1 * | 10/2013 | Nakazawa | H01L 21/67132 414/800 |
| 2014/0033518 | A1 * | 2/2014 | Ito | B30B 15/34 29/739 |
| 2015/0034700 | A1 * | 2/2015 | Zhang | B23K 1/0016 228/49.5 |
| 2015/0053350 | A1 | 2/2015 | Han et al. | |
| 2015/0144683 | A1 * | 5/2015 | Ootake | B23K 3/0638 228/248.1 |
| 2015/0264846 | A1 * | 9/2015 | Shimizu | H05K 13/021 414/222.09 |
| 2015/0274435 | A1 * | 10/2015 | Shimizu | H05K 13/021 414/222.01 |

FOREIGN PATENT DOCUMENTS

| | | | |
|---|---|---|---|
| JP | 10163276 A * | 6/1998 | |
| JP | 2003249530 A * | 9/2003 | |
| JP | WO 2007066559 A1 * | 6/2007 | H01L 24/75 |

* cited by examiner

FIG. 15
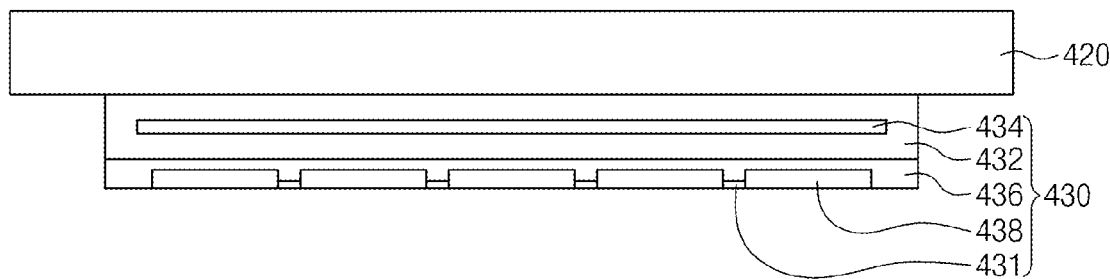
FIG. 16
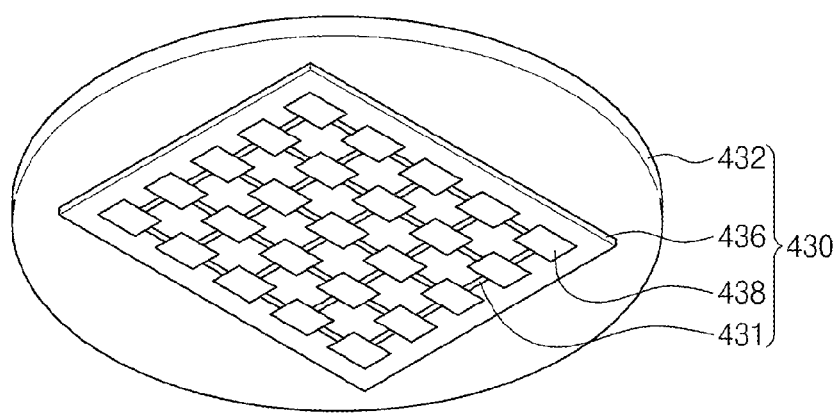
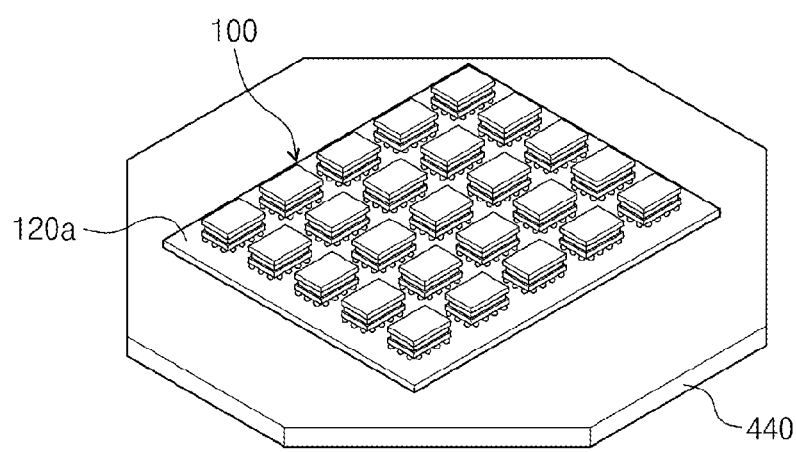

ial section of an
BONDING APPARATUS AND SUBSTRATE MANUFACTURING EQUIPMENT INCLUDING THE SAME

PRIORITY STATEMENT

This U.S. non-provisional patent application claims priority under 35 U.S.C. §119 of Korean Patent Application No. 10-2014-0144437, filed on Oct. 23, 2014, the entire contents of which are hereby incorporated by reference.

BACKGROUND

The inventive concept relates to the manufacturing of semiconductor devices, especially the assembling of multi-chip semiconductor device packages. More particularly, the inventive concept relates to bonding apparatus for bonding a semiconductor chip to a substrate and to semiconductor device manufacturing equipment including the same.

In the electronics industry, the demand for electronic components which have increased numbers of functions and offer quicker response times while at the same time being miniaturized is increasing. In response to these demands, semiconductor mount technology has been developed to fabricate various types of multi-chip components, e.g., a component in which semiconductor chips are stacked and mounted on a substrate or a package on package (POP). Such mount technology requires the bonding of solder bumps and conductive pads, which may constitute electrical terminals of a substrate and a semiconductor chip mounted to the substrate or of semiconductor chips stacked on each other.

SUMMARY

Representative embodiments of bonding apparatus according to the inventive concept include an upper stage, a lower stage facing the upper stage and dedicated to support a stack of electronic components to be bonded, and an elevating mechanism that raises and lowers the lower stage relative to the upper stage to produce pressure for compressing a stack of components supported by the lower stage. The upper stage has a body having a bottom surface facing towards the lower stage; an elastic section at the bottom surface of the body, and an array of blocks supported by the elastic section and exposed at the bottom of the upper stage. Accordingly, the blocks can contact and compress an array of components supported by the lower stage as the upper and lower stages are brought towards each other by the elevating mechanism.

Other representative embodiments of bonding apparatus according to the inventive concept include a frame, an upper stage disposed within and supported by an upper portion of the frame, a lower stage disposed within and supported by a lower portion of the frame and which in turn is dedicated to support a stack of electronic components to be bonded, and a jack disposed under the frame and connected to the lower stage to move the lower stage towards the upper stage such that a stack of components supported by the lower stage can be compressed by and between the upper and lower stages. The upper stage comprises a body having a bottom surface facing towards the lower stage, an elastic section at the bottom surface of the body, and an array of blocks supported by the elastic section and exposed at a bottom of the upper stage. Accordingly, the blocks can contact and compress an array of components supported by the lower stage as the lower stage is brought towards the upper stage by the jack.

Representative embodiments of semiconductor device manufacturing equipment include a chip mounter that produces an unbonded stack of electronic components including chips disposed on a substrate, a bonding apparatus, and a transfer unit. The chip mounter comprises a substrate support and a chip picker that sets chips in an array on a substrate supported by the substrate support. The bonding apparatus bonds the chips. The bonding apparatus comprises a lower stage, an upper stage including a body having a bottom surface facing towards the lower stage, an elastic section at the bottom surface of the body, and an array of blocks supported by the elastic section and exposed at the bottom of the lower stage, and an elevating mechanism that raises and lowers the lower stage relative to the upper stage. The transfer unit that transfers the unbonded stack of electronic components from the chip mounter to the lower stage of the bonding apparatus. Accordingly, the blocks of the bonding apparatus can contact the array of chips of an unbonded stack of electronic components supported by the lower stage and compress the stack with the lower stage as the upper and lower stages are brought towards each other by the elevating mechanism.

BRIEF DESCRIPTION OF THE DRAWINGS

The accompanying drawings are included to provide a further understanding of the present inventive concept, and are incorporated in and constitute a part of this specification. The drawings illustrate exemplary embodiments of the present inventive concept and, together with the written description, serve to explain principles of the present inventive concept. In the drawings:

FIG. 15 is a longitudinal sectional view of embodiments of an upper stage of the bonding apparatus;

FIG. 16 includes perspective views of examples of the stages of the bonding apparatus including an example of the embodiment of the upper stage shown in FIG. 15;

DETAILED DESCRIPTION OF THE PREFERRED EMBODIMENTS

Figure 1:
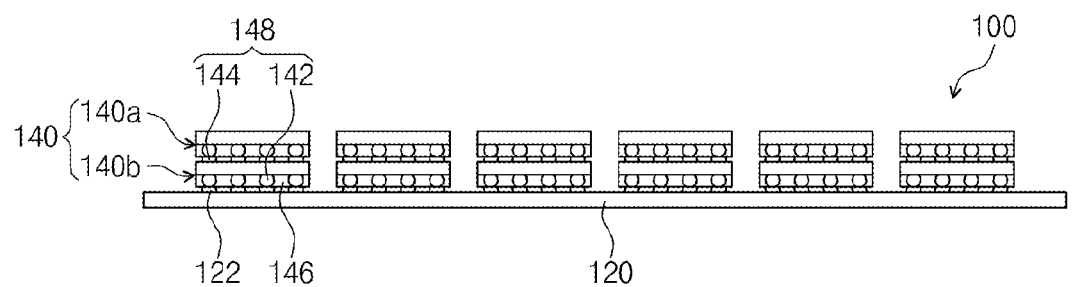
FIGS. 1, 2 and 3 are cross-sectional views of examples of articles of manufacture comprising semiconductor devices which may be fabricated using bonding apparatus according to the inventive concept.

Exemplary embodiments of the inventive concept will be described below in more detail with reference to the accompanying drawings. Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. Like reference numerals designate like elements throughout.

It will also be understood that when an element is referred to as being "on" or "connected to" another element, it can be directly on or directly connected to the other element or intervening elements may be present. Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "extending" will generally reference the lengthwise direction, i.e., the greatest dimension, of an element or feature, especially one having a line-shaped form, as the context and drawings will make clear.

According to an embodiment of the inventive concept, a bonding apparatus is provided to bond (physically or both physically and electrically) at least first and second electronic components. The first component may have a first electrical connection terminal at an upper surface thereof, and the second component may have a first electrical connection terminal. For example, the first component may be a substrate, and its electrical connection terminal may be a pad disposed at a surface of the substrate. The second component may be a semiconductor chip, and its electrical connection terminal may be a (solder) bump provided on surface of the semiconductor chip. The semiconductor chip may be flip-chip bonded in which case the electrical connection terminal is located at an active surface of the chip.

Also, the second component may have a second electrical connection terminal at an opposite side of the body of the chip from the side at which its first electrical connection terminal is disposed. The bonding apparatus may bond a third component, having an electrical connection terminal, to the first and second components. More specifically, the first, second, and third components may be stacked in the foregoing order. The second electrical connection terminal of the second component may be a pad, and the electrical connection terminal of the third component may be a bump. The electrical connection terminal of the third component may be bonded to the second electrical connection terminal of the second component by the bonding process.

Various examples of the semiconductor devices that can be fabricated using equipment and apparatus according to the inventive concept will be described in more detail with reference to FIGS. 1 to 3.

Referring to FIG. 1, a semiconductor device 100 which can be fabricated may include a substrate 120 and semiconductor chips 140 on the substrate 120. The substrate 120 may be a printed circuit board (PCB) or a semiconductor wafer. The plurality of semiconductor chips 140 may be stacked on the substrate 120. For example, two semiconductor chips 140 may be stacked on the substrate 120. A plurality of substrate pads 122 may connect the semiconductor chips 140 to the substrate 120. Although not shown, another chip may be disposed in the substrate 120 under the substrate pads 122. Electrical connection members 148 may be disposed at bottom and top surfaces of each of the semiconductor chips 140. According to one example, each of the connection members 148 includes a bump 142 and a device pad 144. The bump 142 may be disposed at a bottom surface of the semiconductor chip 140. The device pad 144 may be disposed at a top surface of the semiconductor chip 140.

The bump 142 may be disposed between a body of the semiconductor chip 140 and the substrate pad 122. The device pad 144 may be disposed between the semiconductor chip 140 and the bump 142. The device pad 144 may not be disposed on a top surface of a first semiconductor chip 140a that is disposed at the uppermost position. The semiconductor chips 140 stacked on each other may include the same kind of first and second chips 140a and 140b. For example, both of the first and second semiconductor chips 140a and 140b may be memory chips. The first and second semiconductor chips 140a and 140b may have the same size. The first semiconductor chip 140a may be disposed on the second semiconductor chip 140b. Each of the first and second semiconductor chips 140a and 140b may have the bump 142 that is disposed on the bottom surface thereof. The second semiconductor chip 140b may have the device pad 144 disposed on the top surface thereof. The bump 142 of the second semiconductor chip 140b may contact the substrate pad 122, and the bump 142 of the first semiconductor chip 140a may contact the device pad 144 of the second semiconductor chip 140b.

An adhesion member 146 may be disposed on the bottom surface of each of the first and second semiconductor chips 140a and 140b. According to one example, the adhesion member 146 may be a non-conductive film (NCF). Selectively, the adhesion member 146 may be a non-conductive paste, an anisotropic conductive film, or an anisotropic conductive paste.

Figure 2:
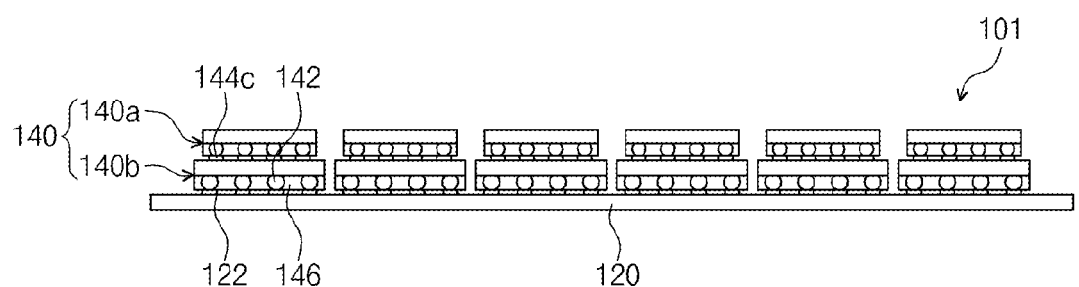

FIG. 2 is a view illustrating one example of a semiconductor device 101 according to embodiments of the inventive concept.

Referring to FIG. 2, semiconductor chips 140 stacked on each other may be different kinds of semiconductor chips. According to one example, a first semiconductor chip 140a may have a size less than that of a second semiconductor chip 140. The first semiconductor chip 140a may be a memory chip, and the second semiconductor chip 140b may be a controller chip. The first semiconductor chip 140a may be disposed on the second semiconductor chip 140b. Bumps 142 of the first and second semiconductor chips 140a and 140b may be spaced apart from each other at distances different from each other. For example, the substrate pads 122 may be spaced apart from each other in a distance greater than that between the device pads 144c. The bumps 142 of the second semiconductor chip 140b may be spaced apart from each other in a distance greater than that between the bumps 142 of the first semiconductor chip 140a. Alternatively, bumps 142 of the first and second semiconductor chips 140a and 140b may be spaced apart from each other at the same interval. When the first semiconductor chip 140a has a size greater than that of the semiconductor chip 140b, the second semiconductor chip 140b may be disposed on the first semiconductor chip 140a.

Figure 3:
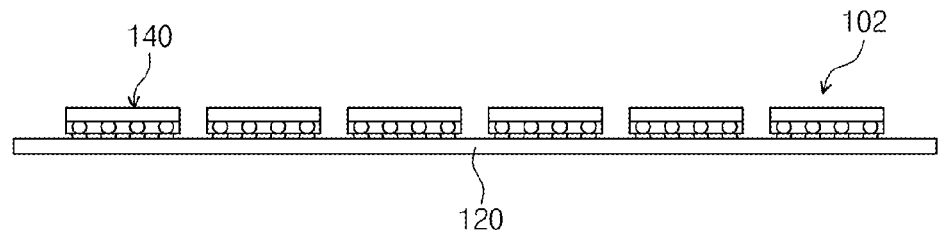

FIG. 3 is a view illustrating one example of a semiconductor device 102 according to embodiments of the inventive concept.

Referring to FIG. 3, a semiconductor device 102 may include single-layered semiconductor chips 140 on a substrate 120. The single layered semiconductor chips 140 may be controller or memory chips.

In FIGS. 1 to 3, several semiconductor chips 140 are mounted on one substrate 120. However, several hundreds to several thousands of semiconductor chips 140 may be mounted on the substrate 120 that is the wafer. Also, several tens to several hundreds of semiconductor chips 140 may be mounted the substrate 120 that is the PCB.

In the following embodiment, a semiconductor device 100 in which two semiconductor chips 140 are stacked on each other on the substrate 120 will be described.

Figure 4:
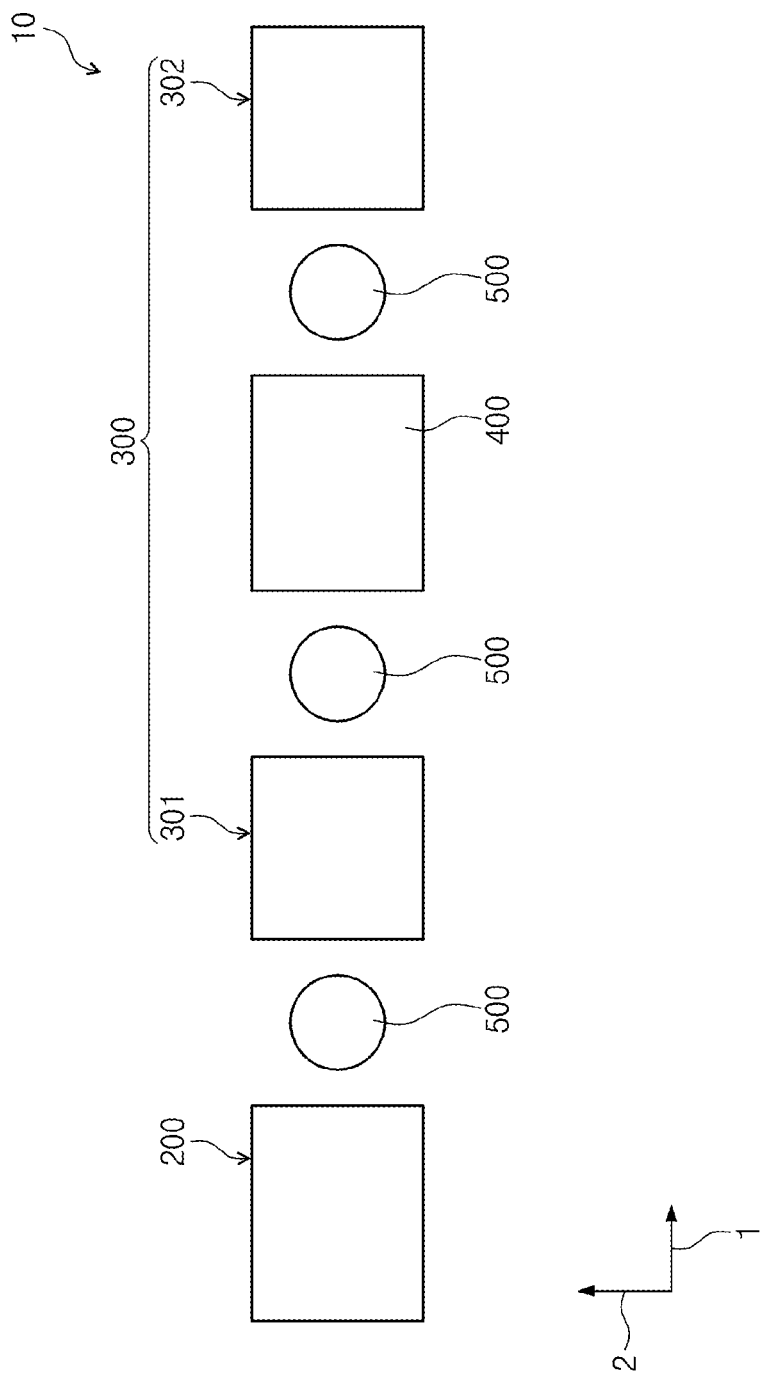
FIG. 4 is a schematic diagram of an embodiment of semiconductor device manufacturing equipment according to the inventive concept.

FIG. 4 illustrates an embodiment of substrate manufacturing equipment according to the inventive concept.

Referring to FIG. 4, substrate manufacturing equipment 10 may include a chip mounter 200, an inspection apparatus 300, a bonding apparatus 400, and transfer units 500. The chip mounter 200 performs a mounting process for mounting a semiconductor chip 140 on a substrate 120. The bonding apparatus 400 may bond the electrical connection members 148 between the semiconductor chip 140 and the substrate 120 and between the semiconductor chips 140 stacked on each other. The inspection apparatus 300 may include a mounting inspection unit 301 and a bonding inspection unit 302. In one example of the manufacturing equipment 10, the chip mounter 200, the mounting inspection unit 301, the bonding apparatus 400, and the bonding inspection unit 302 are disposed adjacent to each other. After the mounting process is completed, the mounting inspection unit 301 may inspect whether the semiconductor chips 140 and the substrate 120 are properly aligned or whether the first and second semiconductor chips 140a and 140b stacked on each other are properly aligned. After the bonding process is completed, the bonding inspection unit 302 may inspect whether the semiconductor chips 140 and the substrate 120 are still properly aligned or whether the first and second semiconductor chips 140a and 140b are still properly aligned. The mounting inspection unit 301 and the bonding inspection unit 302 are each optional, though, and either or both may be omitted from the substrate manufacturing equipment 10.

The transfer unit 500 may transfer the semiconductor device 100 between the chip mounter 200 and the mounting inspection unit 301, between the mounting inspection unit 301 and the bonding apparatus 400, and between the bonding apparatus 400 and the bonding inspection unit 302. The chip mounter 200, the inspection apparatus 300, and the bonding apparatus 400 may be successively disposed in a line along a first direction 1. Alternatively, the chip mounter 200 and the inspection apparatus 300 may be disposed along the first direction 1, and the inspection apparatus 300 and the bonding apparatus 400 may be disposed along a second direction 2. The first and second directions 1 and 2 may be perpendicular to each other when viewed from above. The chip mounter 200, the inspection apparatus 300, and the bonding apparatus 400 may be integrated units or may be spaced apart from each other in a manufacturing line. In any case, a plurality of semiconductor devices 100 which are to be processed within any one apparatus may be accommodated in a transfer container (not shown) and then be transferred to the other apparatus. The transfer container may be a magazine for accommodating a PCB or a front opening unified pod (FOUP) for accommodating a wafer.

A control system (not shown) of a type that is conventional, per se, for controlling units of manufacturing equipment is operatively connected to the chip mounter 200, inspection apparatus 300, and bonding apparatus 400 for controlling the operations of the same. For instance, the control system is configured to control the chip mounter 200 to set chips on a substrate in a predetermined pattern or array in a manner described in more detail below, and then control the transfer unit 500 to transfer the article including unbounded chips and the substrate past the inspection apparatus 300 and to the bonding apparatus 400.

Figure 5:
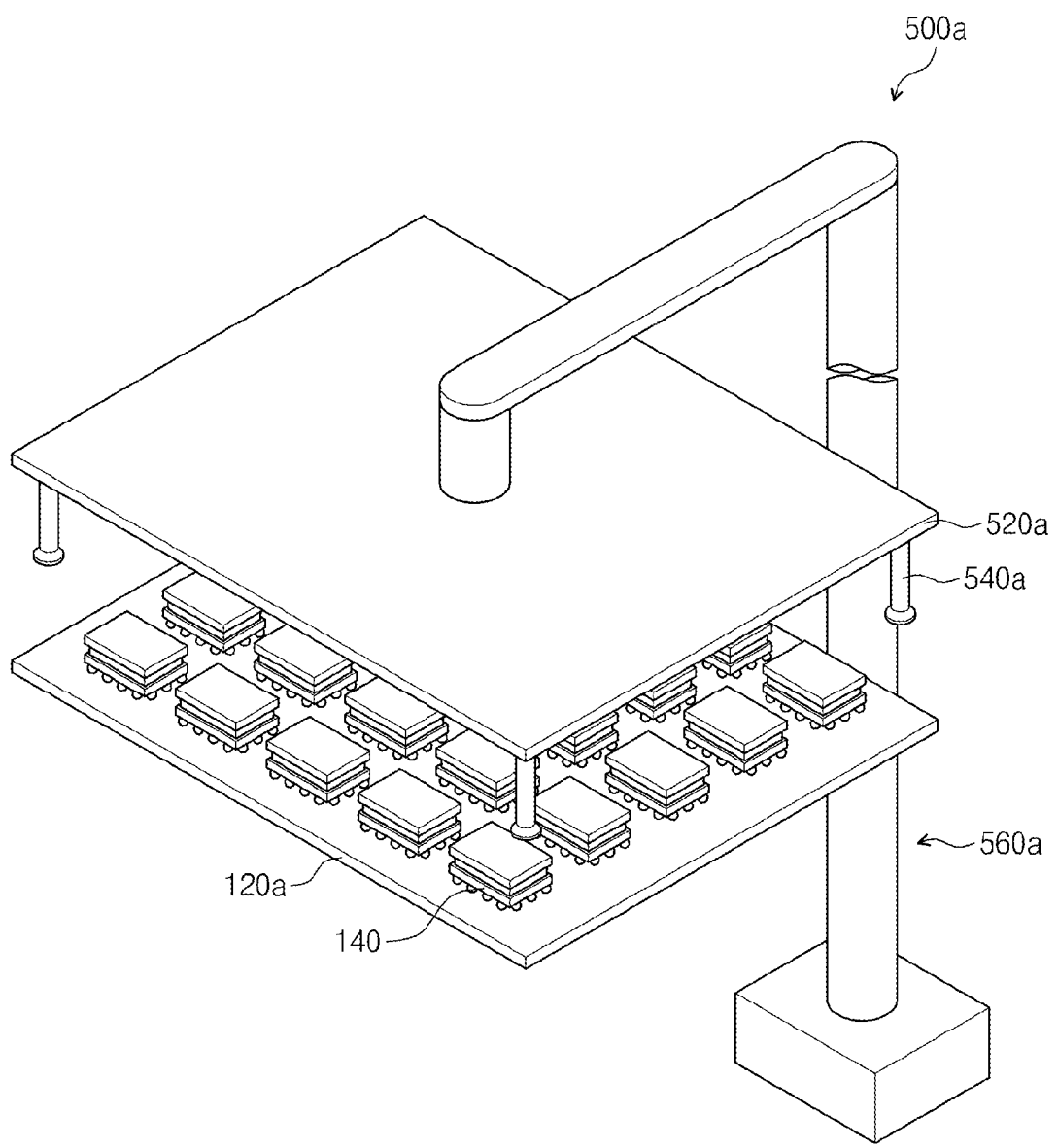
FIGS. 5 and 6 are perspective views of examples of a transfer unit of the manufacturing equipment of FIG. 4.

FIG. 5 illustrates one example of the transfer unit 500 of the equipment of FIG. 4. The transfer unit of FIG. 5 may be used when the substrate 120 is a PCB.

Referring to FIG. 5, the transfer unit may comprise a handler 500a. The handler 500a has a first base 520a, a vacuum pad 540a, and a first base driving unit 560a. The first base 520a may have the shape of a plate. The vacuum pad 540a may protrude downward from a bottom surface of the first base 520a. A plurality of vacuum pads 540a may be provided. According to one example, four vacuum pads 540a are provided to respectively hold four sides of a PCB 120a using a vacuum. The first base 520a may be driven vertically or rotated about a vertical axis or moved in a horizontal plane by the first base driving unit 560a.

Figure 6:
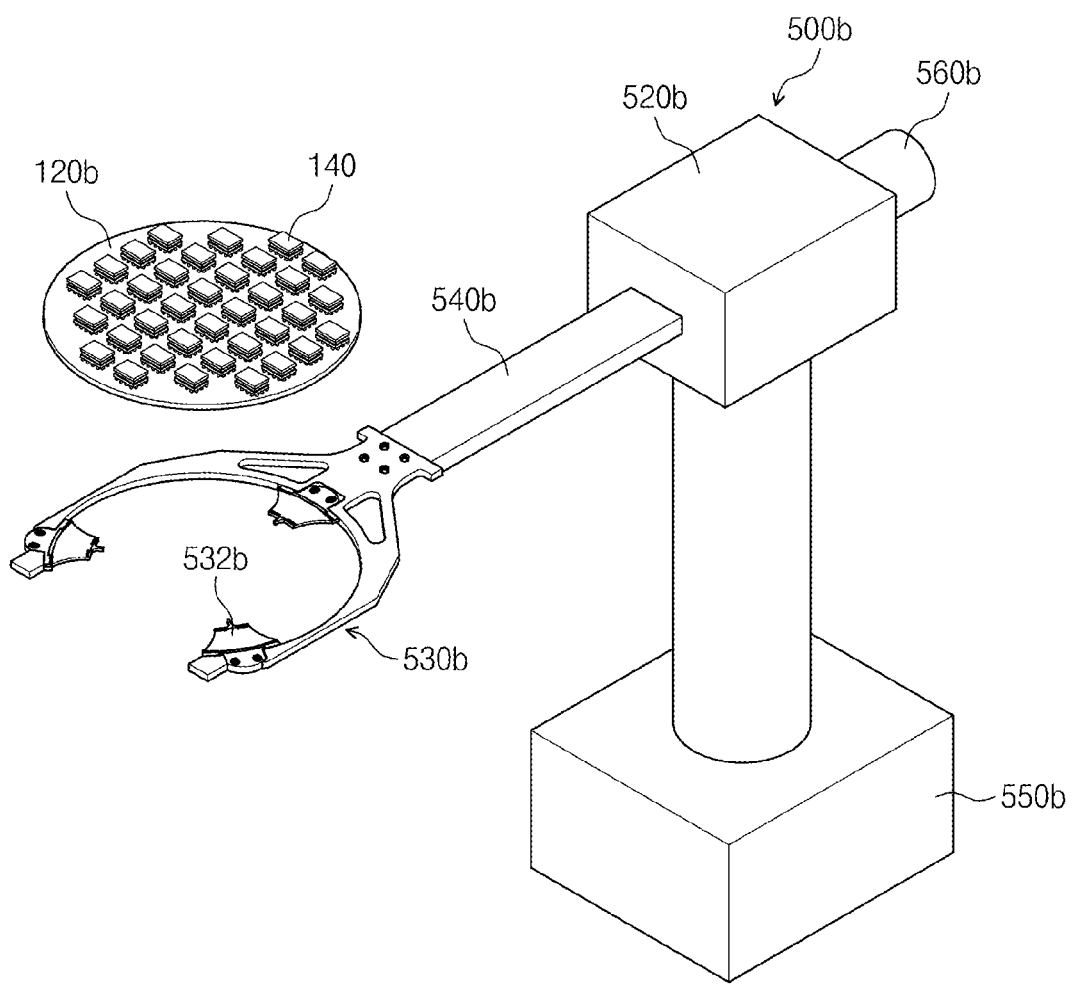

FIG. 6 illustrates another example of the transfer unit 500 of the equipment of FIG. 4. The transfer unit of FIG. 6 may be used when the substrate 120 is a wafer.

Referring to FIG. 6, the transfer unit may comprise a transfer robot 500b. The transfer robot 500b may have a base 520b, a hand 530b, an arm 540b, a base driving unit 550b, and an arm driving unit 560b. The base 520b has a rectangular parallelepiped shape. The arm 540b may extend forward from the second base 520b. The hand 530b may be fixedly coupled to an end of the arm 540b. The hand 530b may be configured to support a bottom surface of the substrate 120. To this end, the hand 530b may have a substantially annular back portion and an open front portion. A support body 532b for supporting the bottom surface of the wafer 120b at its periphery may be disposed on an inner surface of the hand 530b. The arm 540b may be horizontally extended or retracted by the arm driving unit 560b. The base 520b may be driven vertically by the base driving unit 550b.

The transfer unit 500 is not limited to those examples illustrated in FIGS. 5 and 6, however. For example, the transfer unit 500 may instead comprise a rail or conveyor for linearly moving the semiconductor device 100. Also, the transfer units 500 of FIG. 4 may have structures different from each other.

Figure 7:
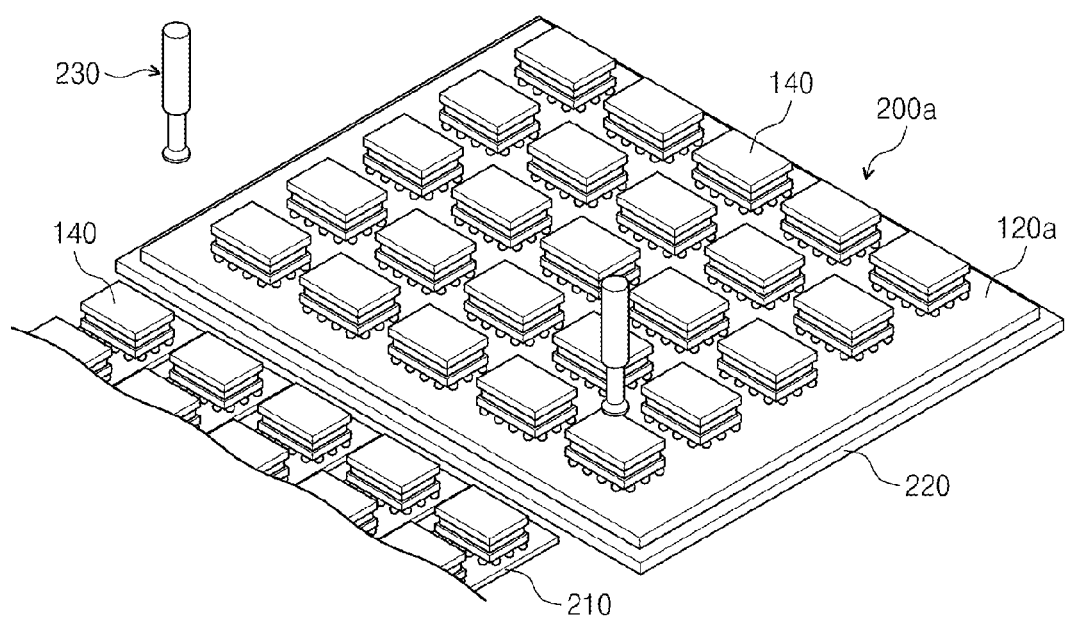
FIGS. 7 and 8 are perspective views of examples of chip mounters of the manufacturing equipment of FIG. 4.

FIG. 7 illustrates one example of a chip mounter 200 of the equipment of FIG. 4. The chip mounter of FIG. 7 may be used when the substrate 120 is the PCB 120a.

Referring to FIG. 7, the chip mounter may be a rotary type mounter 200a. The rotary type mounter 200a may include a chip buffer 210, a substrate support in the form of a gantry 220, and pickers 230. The chip buffer 210 may store semiconductor chips 140 to be mounted on the PCB 120a. The picker 230 may comprise a vacuum chuck that can pick a semiconductor chip 140 from the chip buffer 210 using a vacuum. The gantry 220 may move the PCB 120a close to the chip buffer 210. The picker 230 places the semiconductor chips 140 picked from the buffer 210 on the PCB 120a supported by the gantry 220 to form a loose stack of components comprising the PCB 120a and chips 140 set thereon. The picker 230 may also place a chip 140 on another chip already disposed on the PCB 120a, in fabricating the example of the article of manufacture shown in FIG. 2.

Figure 8:
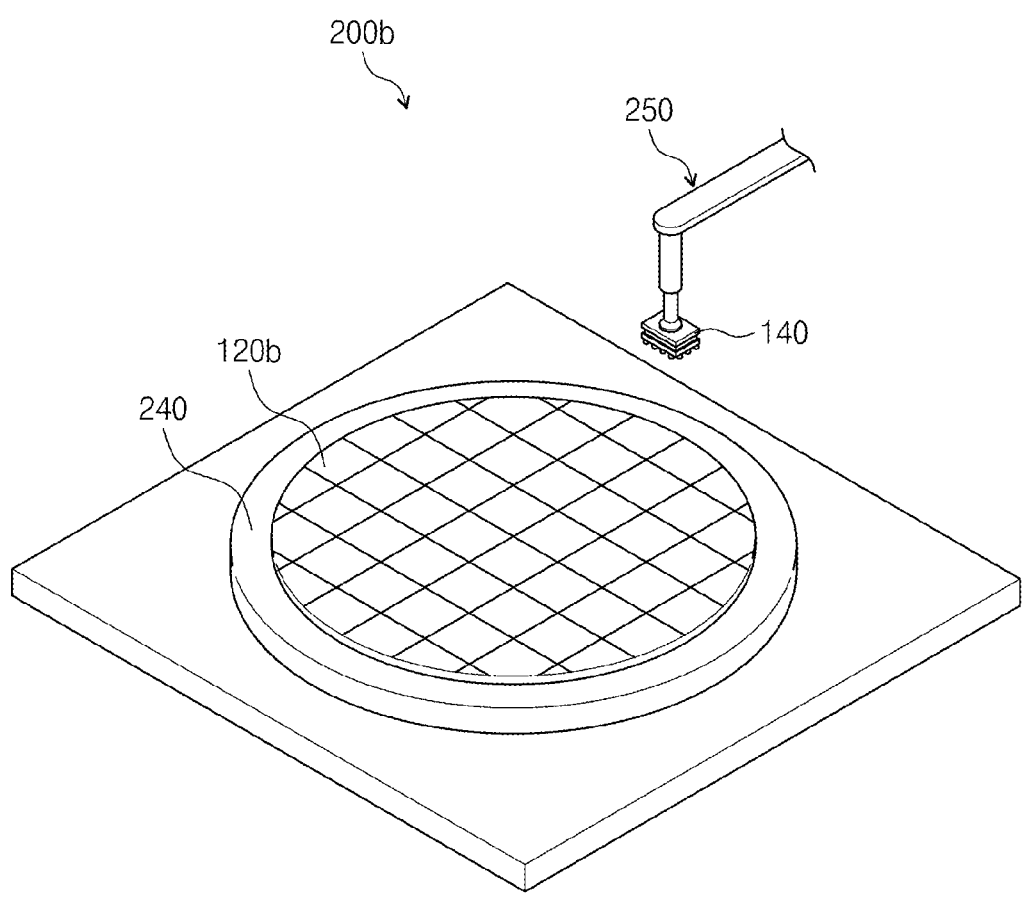

FIG. 8 is illustrates another example of the chip mounter 200 of the equipment of FIG. 4. The chip mounter of FIG. 8 may be used when the substrate 120 is the wafer 120b.

Referring to FIG. 8, the chip mounter may be a turret type mounter 200b. The turret type mounter 200b may include a substrate support comprising a chuck 240 and a chip picker including a vacuum head 250. The chuck 240 may be a vacuum chuck that holds the wafer 120b in place using a vacuum. The head 250 may place the semiconductor chips 140 on the wafer 120b to form a loose stack of electronic components comprising the wafer 120b and the chips 140.

The chip mounter 200, however, is not limited to the examples illustrated in FIGS. 7 and 8 but may have other forms of substrate supports and chip pickers.

Referring again to FIG. 4, the mounting inspection unit 301 may have a structure that is substantially similar to that of the bonding inspection unit 302. According to one example, the mounting inspection unit 301 and the bonding inspection unit 302 may have an optical system by which semiconductor chip 140 or stacked semiconductor chips 140 be observed, and by which a state of alignment between the semiconductor chip 140 and the substrate 120 or the semiconductor chips 140 can be determined.

FIGS. 9-12 illustrate an example of the bonding apparatus 400 of the equipment of FIG. 4. The bonding apparatus 400 is a device for bonding the semiconductor chips 140 mounted on the substrate 120 in the chip mounter 200. According to one example, the bonding apparatus 400 may bond the semiconductor chips 140 on the substrate 120 in a gang bonding manner, i.e., may bond numerous semiconductor chips 140 at a time.

Figure 9:
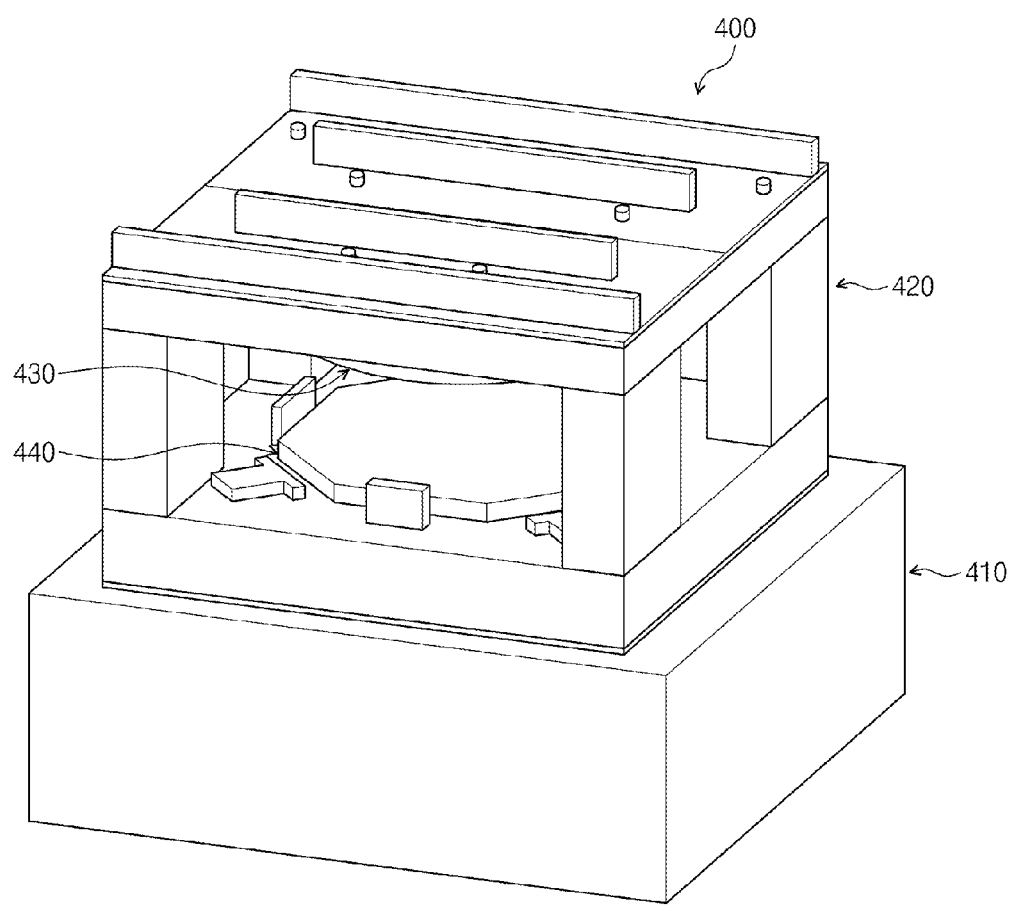
FIG. 9 is a perspective view of an example of a bonding apparatus of the manufacturing equipment of FIG. 4.
Figure 12:
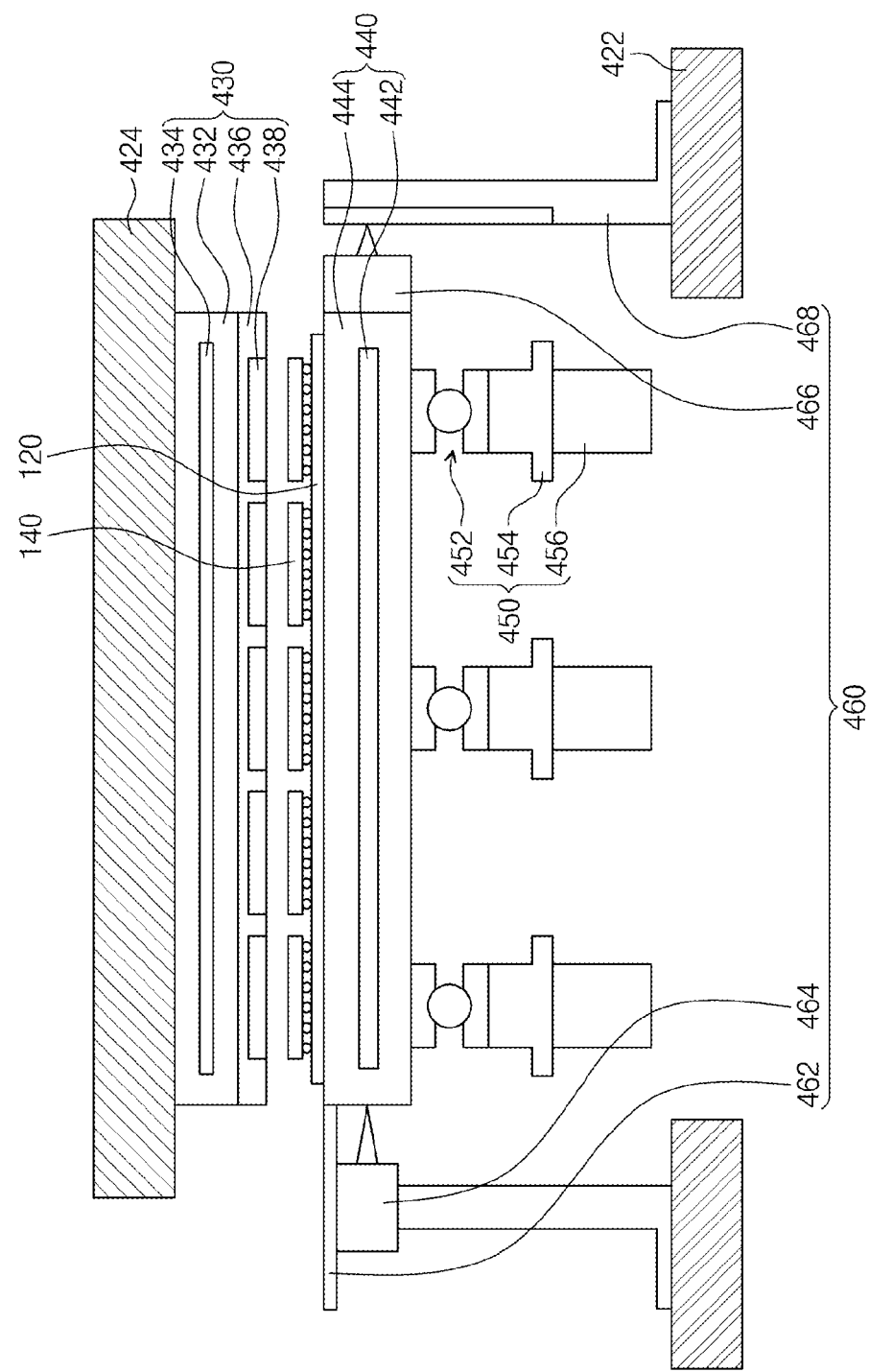
FIG. 12 is a schematic diagram of the bonding apparatus illustrating an upper stage, a lower stage, a push member, and a stage position monitoring part of the bonding apparatus.

Referring to FIGS. 9 and 12, the bonding apparatus 400 may include a bonding base 410, a frame 420, an upper stage 430, a lower stage 440, an elevating mechanism such as a jack connected to the lower stage 140 and comprising at least one push member 450, and a stage position monitoring part 460. The bonding base 410 may support the frame 420. The upper stage 430, the lower stage 440, and the push members 450 may act together to compress components of the semiconductor device together in performing the bonding process. The stage position monitoring part 460 may monitor a position of the lower stage 440. The lower stage 440 is dedicated to support the components that will form a semiconductor device after having been bonded. When the substrate is the PCB 120a, one or a plurality of PCBs 120a may be disposed on and supported by the lower stage 440. When the substrate 120 is the wafer 120b, one wafer 120b may be disposed on and supported by the lower stage 440. The upper and lower stages 430 and 440 may be disposed to face each other. Each of the lower and upper stages 440 and 430 may be formed of a ceramic or aluminum material. The lower stage 440 may be movable upward from the bonding base 410 and disposed above the bonding base 410. Surfaces of the upper and lower stages 430 and 440, which face each other, may have the same size. Hereinafter, each of the parts will be described in more detail.

Figure 10:
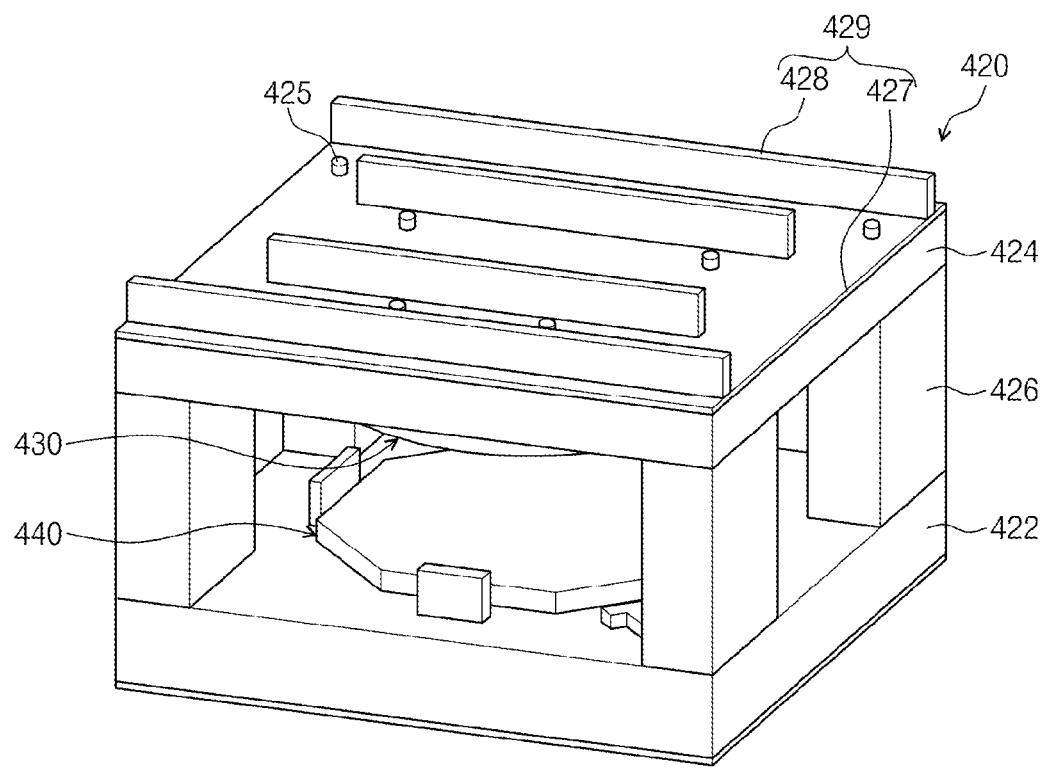
FIG. 10 is a perspective view of an upper part of the bonding apparatus.

Referring to FIG. 10, the frame 420 has a lower plate 422, an upper plate 424, and columns 426. Each of the lower and upper plates 422 and 424 may have a substantially rectangular shape. The lower and upper plates 422 and 424 may have sizes similar to each other. The lower and upper plates 422 and 424 are vertically spaced apart from each other and are coupled to each other by the columns 426. To this end, four columns 426 may be disposed at the corners of the lower and upper plates 422 and 424. The lower plate 422, the upper plate 424, and the column 426 may comprise rigid material. According to one example, the lower plate 422, the upper plate 424, and the column 426 may comprise granite.

A respective reinforcement member 429 may be mounted on the lower and/or upper plate 422, 424. In this respect, the reinforcement plate 429 may be coupled to the lower or upper plate 422 or 424 by bolts 425. The reinforcement member 429 may increase the tensile strength of the overall structure including the lower and/or upper plate 422, 424. The reinforcement plate 429 may be formed of steel. The reinforcement member 429 may have a flat plate 427 that is in contact with the lower or upper plate 422 or 424 and at least one rib 428 protruding from the plate 427 in a direction far away from the column 426. In the case in which a plurality of ribs 128 is provided, the ribs 428 may extend parallel to each other.

Figure 11:
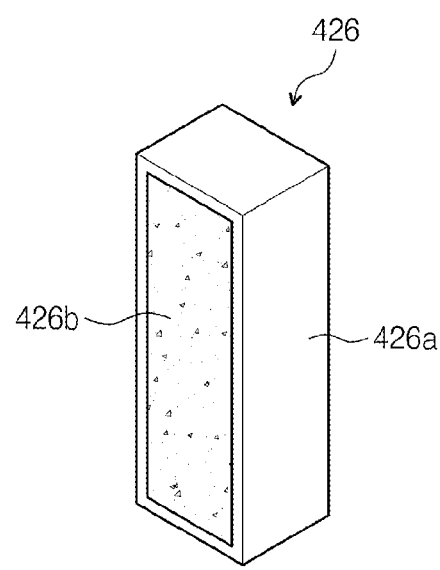
FIG. 11 is a perspective view of a longitudinal section of column of the bonding apparatus.

Referring to FIG. 11, the column 426 may have an outer body 426a and a filler 426b of material different from that of the outer body 426a. The filler 426b may be of a relatively rigid material and may be of material that is more rigid than that of the outer body 426a. For example, the filler 426b may be concrete or polymer concrete.

Referring again to FIG. 12, the upper stage 430 may be disposed on a bottom surface of the upper plate 424. According to one example, the upper stage 430 includes a first body 432, a first heating member 434, an elastic section or member 436 such as a pad of elastomeric material, and press blocks 438. The press blocks 438 may be of material that is more rigid than the elastomeric material of the member 436. The first body 432 may be fixed to the upper plate 424 of the frame 420. The bottom surface of the first body 432 may be a substantially planar surface oriented horizontally. The first heating member 434 may be disposed in the first body 432. The first heating member 434 may heat the semiconductor chip 140 when the bonding process is performed. The first heating member 434 may comprise a Mica plate heater. The elastic member 436 may be disposed on the bottom surface of the first body 432.

During the bonding process, the thickness of the device is reduced, which action could increase differences among the pressures being exerted on the semiconductor chips 140. The elastic member 436 serves to minimize the pressure differences between the semiconductor chips 140 to minimize bonding defects. In particular, the elastic member 436 may accommodate for difference in height between the semiconductor chips 140 that occur as the chips 140 are being compressed during the bonding process. The semiconductor chips 140 may be compressed under the same pressure even though height differences arise between the semiconductor chips 140. According to one example, the elastic member 436 is formed of rubber having excellent thermal resistance.

The press blocks 438 may be disposed on the elastic member 436. The press blocks 438 may be aligned above the semiconductor chips 140 on the substrate 120. Furthermore, the press blocks 438 are formed of hard plastic or metal, for example. As the upper stage 430 approaches the lower stage 440, the press blocks 438 may press the semiconductor chips 140 against the substrate 120. Pressures between the press blocks 438, the upper stage 430, and the lower stage 440 may be concentrated on the semiconductor chips 140. The press blocks 438 may minimize the effects of deviations among the form and density of the bumps 142 between the semiconductor chips 140 and the substrate 120. For example, in a case in which the bumps 142 are concentrated on one side of the semiconductor chip 140, the elastic member 436 may press the semiconductor chip 140 toward the other side such that the semiconductor chip 140 is tilted. As a result, bonding defects may occur between the semiconductor chips 140. The press blocks 438, though, ensure that the semiconductor chips 140 remain parallel to the substrate 120. Accordingly, the press blocks 438 minimize the bonding defects and may prevent bonding defects from occurring altogether.

The lower stage 440 may include a second body 444 and a second heating member 442. The second body 444 may be dedicated and configured to support a particular type of substrate 120 such as either of those described above. The second heating member 442 may be disposed in the second body 444 to heat the substrate 120 during the bonding process. The second heating member 442 may comprise a Mica plate heater.

Figure 13:
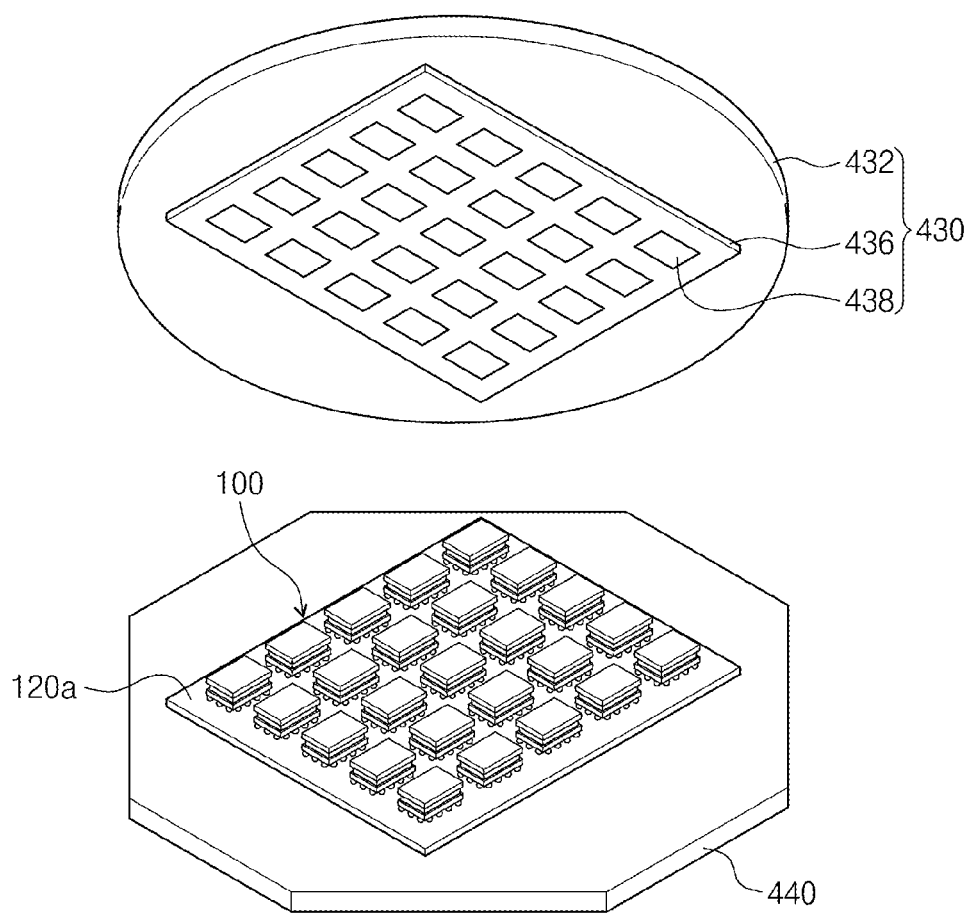
FIG. 13 includes perspective views of examples of the stages of the bonding apparatus.

FIG. 13 illustrates one example of the upper and lower stages 430 and 440 of the bonding apparatus. The first body 432 of the upper stage 430 is a rectangular plate. The elastic member 436 has the same shape as the PCB 120a, i.e., is rectangular. The press blocks 438 are disposed on the elastic member 436 in the form of a matrix. The press blocks 438 and the elastic member 436 may have top surfaces that are positioned at the same height from the first body 432. The lower stage 440 may be hexagonal.

Figure 14:
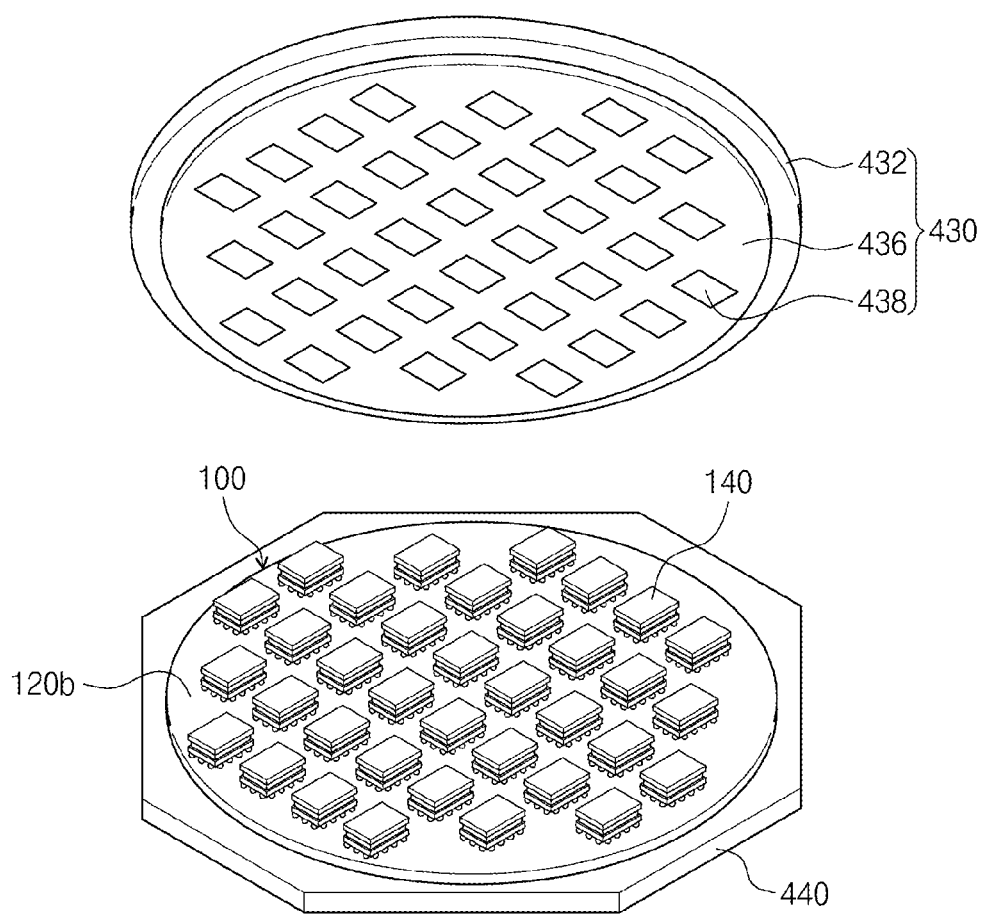
FIG. 14 includes perspective views of other examples of the stages of the bonding apparatus.

FIG. 14 illustrates another example of the upper and lower stages 430 and 440 of the bonding apparatus. In this example, the elastic member 436 has the same shape as the wafer 120b, i.e., is circular. The elastic member 436 also is circular. Similar to the example of FIG. 13, the upper and lower stages 430 and 440 may respectively be circular and hexagonal.

FIG. 15 illustrates another example of the upper stage 430 of the bonding apparatus.

Referring to FIG. 15, the upper stage 430 of this example includes first bridges 431. The first bridges 431 connect the press blocks 438 to each other. The first bridges 431 may maintain uniform horizontal distances between the press blocks 438 as the bonding process is being performed while still allowing the press blocks 438 to move vertically relative to each other. The elastic member 436, the press blocks 438, and the first bridges 431 may have respective top surfaces that are all situated at the same height from the first body 432.

Each first bridge 431 may comprise a flexible film. The flexible film may be a polymer film or a flexible metal pattern. Also, in the case in which the bridges 431 are each of a flexible metal pattern, the first bridges 431 and the press blocks 438 may be formed of the same metal. In the case in which the press blocks are of metal and the bridges 431 are each of a flexible polymer film, the bridges may prevent electrical shorts from occurring between the bonding press blocks 438 on the elastic member 436.

FIG. 16 illustrates an example of the upper stage 430 of FIG. 15 and lower stage 440 for pressing semiconductor chips 140 and PCB 120a together in a bonding process.

Figure 17:
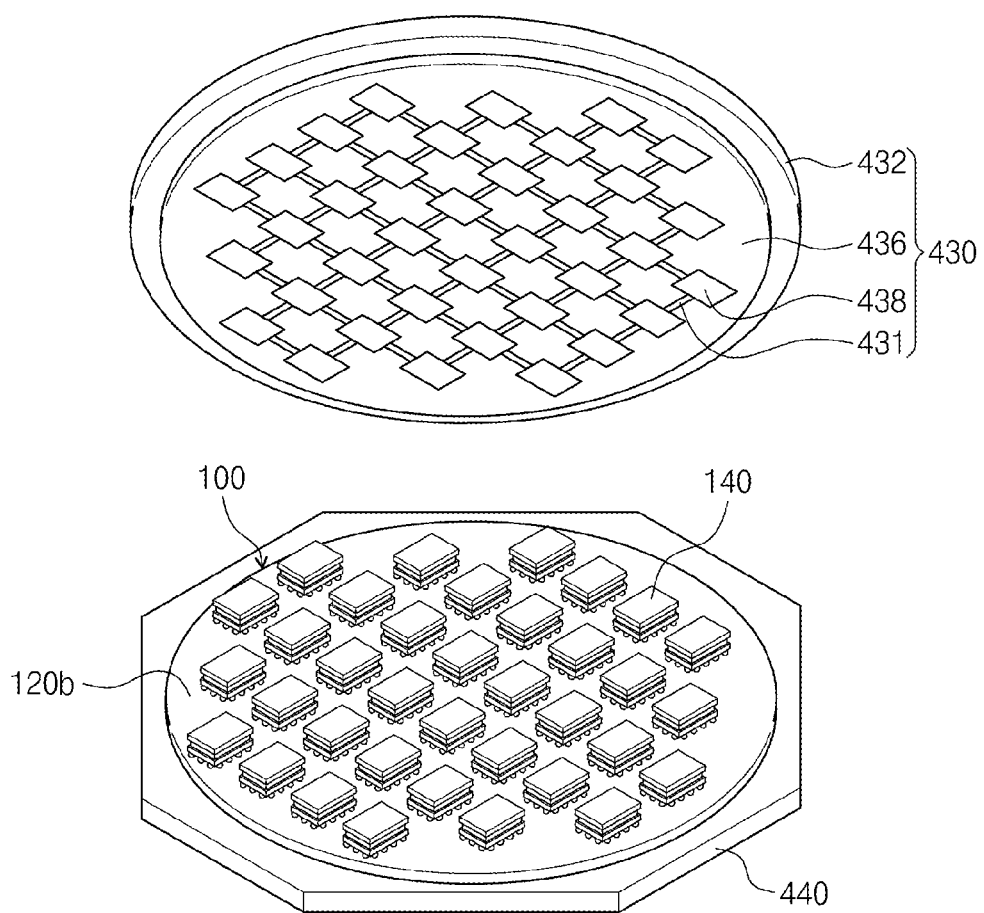
FIG. 17 includes perspective views of examples of the stages of the bonding apparatus including another example of the embodiment of the upper stage shown in FIG. 15.

FIG. 17 illustrates an example of the upper stage 430 of FIG. 15 and lower stage 440 for pressing semiconductor chips 140 and a wafer 120b together in a bonding process. In this example, the press blocks 438 and first bridges 431 delimit and expose cross-shaped portions of the elastic member 436 at the bottom surface of the elastic member 436.

Figure 18:
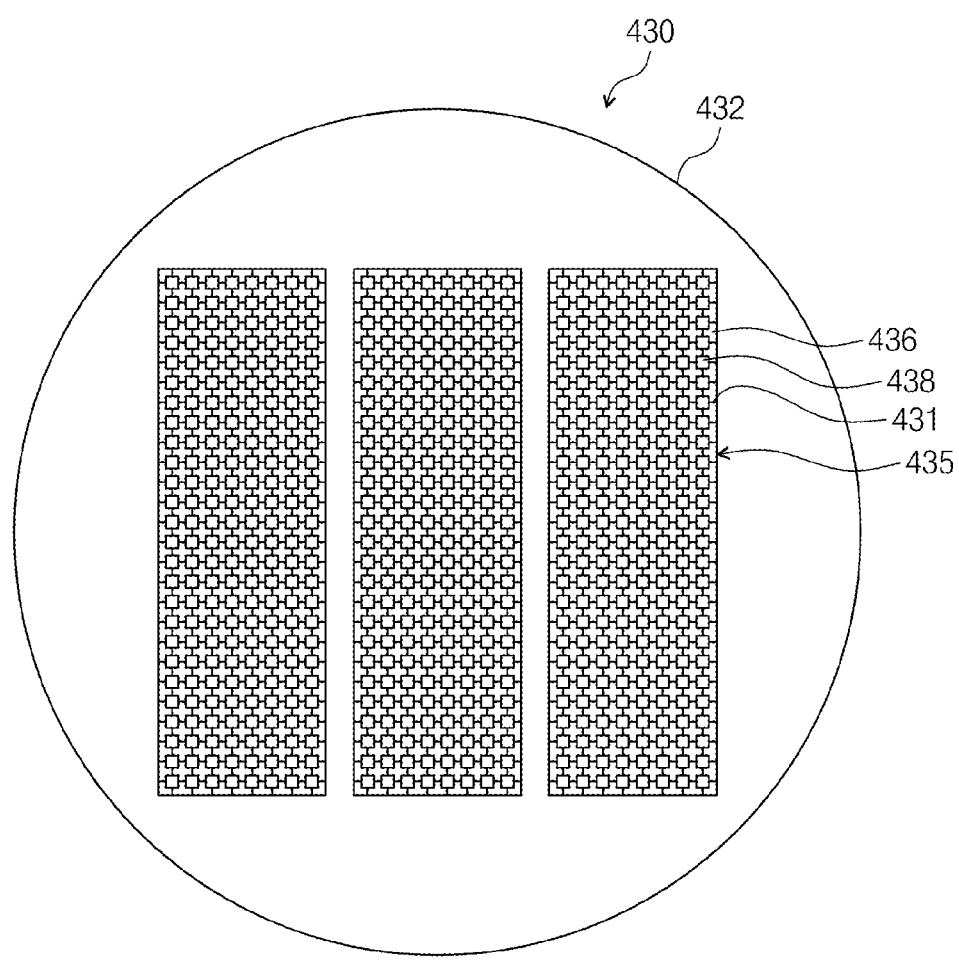
FIG. 18 is a bottom view of still another example of the upper stage shown in FIG. 15.

FIG. 18 illustrates another example of the upper stage 430. The upper stage 430 of this example has a first body 432, a plurality of elastic members 436, press blocks 438, and first bridges 431. For example, three elastic members 436 may be disposed on the first body 431. Each of the elastic members 436 may have the same shape as that of each of a plurality of PCBs 120a on the lower stage 440. For example, the elastic members 436 may each be rectangular. The press blocks 438 may be disposed on the elastic member 436 in the form of a matrix. The press blocks 438 and the first bridges 431 may be disposed in the form of a mesh 435. Each of the press blocks 438 may be disposed at a node of the mesh 435.

Figure 19:
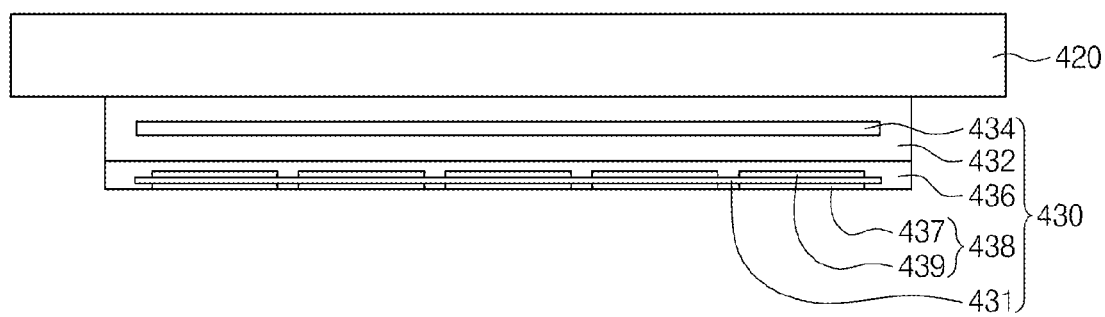
FIG. 19 is a longitudinal sectional view of other embodiments of an upper stage of the bonding apparatus.

FIG. 19 illustrates another example of the upper stage 430 of the bonding apparatus.

Referring to FIG. 19, in this example, the first bridges 431 pass through the press blocks 438. Furthermore, the first bridges 431 may be disposed in or on the elastic member 436. In any case, each of the press blocks 438 may thus have a first section 437 disposed under the first bridge 431, and a second section 439 disposed on the first bridge 431. That is, the first block 437 may be interposed between the first bridge 431 and the first body 432, and the second block 439 is exposed at the bottom surface of the elastic member 436. The first and second sections 437 and 439 may be bonded to the first bridge 431 by an adhesive. Alternatively, the first and second sections 437 and 439 may be screwed or clamped to the first bridge 431.

Figure 20:
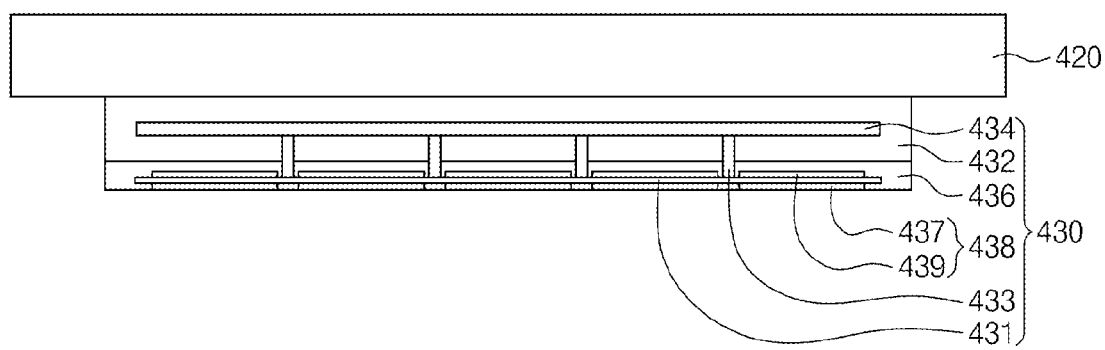
FIG. 20 is a longitudinal sectional view of still further embodiments of an upper stage of the bonding apparatus.

FIG. 20 illustrates another example of the upper stage 430 of FIG. 12.

Referring to FIG. 20, in this example, the upper stage 430 has second bridges 433. The first bridges 431 may be connected to the first heating member 434 through the second bridges 433. The first bridge 431 may extend parallel to the first body 432, and the second bridge 433 may extend perpendicular to the first bridge 431 and the first heating member 434. When the semiconductor chip 140 is pressed against the substrate 120, the elastic member 436 between the press block 438 and the first body 432 may deform. On the other hand, the elastic member 436 between the first bridge 431 and the first body 432 may not deform. The first and second bridges 431 and 433 may not deform. Also, each of the first and second bridges 431 and 433 may transmit heat generated from the first heating member 434 to the press block 438. To this end, for example, each of the first and second bridges 431 and 433 may be formed of a metal. The first bridge 431 may be a metal line. The second bridge 433 may be a contact plug. The press block 438 may be formed of metal for transmitting heat generated from the first heating member 434. Alternatively, the press block 438 may include a heater. Each of the first and second bridges 431 and 433 may provide a power source. The press block 438 may heat the semiconductor chip 140. For example, the semiconductor chip 140 may be heated to a temperature of about 300° C. or less. The press block 438 may heat the semiconductor chip 140 to a temperature of about 120° C. to melt the bonding member 146. The press block 438 may heat the semiconductor chip 140 to a temperature of about 270° C. to reflow or melt the bumps 142 in the bonding process.

Figure 21:
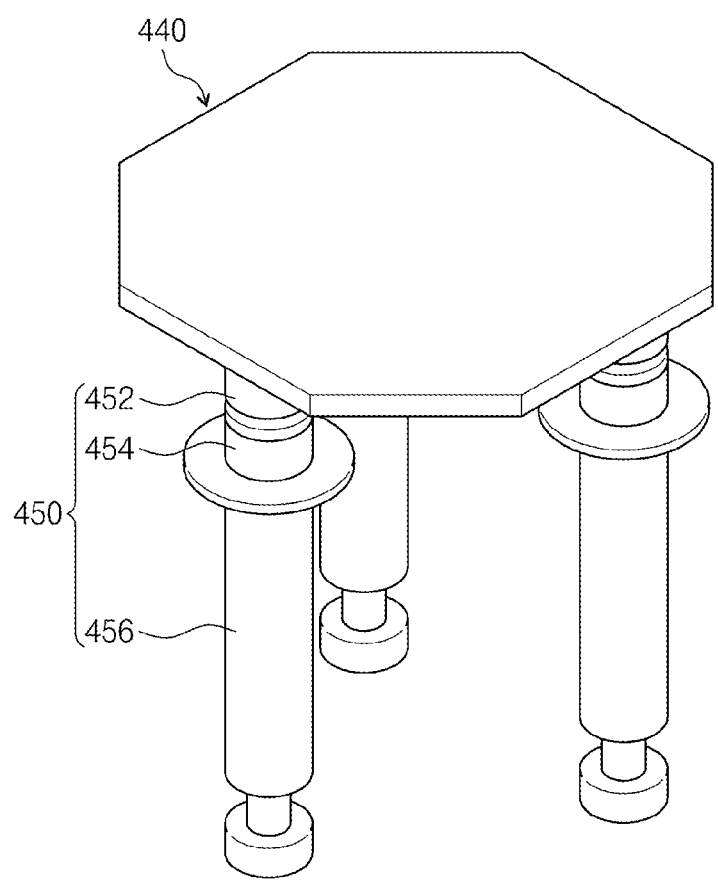
FIG. 21 is a perspective of the lower stage and an example of an elevating mechanism of the bonding apparatus.

FIG. 21 illustrates one example of the jack of the bonding apparatus for raising the lower stage 440.

Referring to FIG. 21, the jack of this example comprises a plurality of push member 450 for raising and lowering the lower stage 440 while (the upper surface of) the lower stage remains oriented parallel to (the lower surface of) the upper stage 430. To this end, each push member 450 may be connected to the lower stage 440 at its bottom surface. In the illustrated example, three push members 450 are provided. The push members 450 may be disposed and act parallel to each other. In this case, the push members 450 may be disposed at equal distances from a central axis of the lower stage 440. Also, the push members 450 may be spaced apart from each other at equal angles with respect to the central axis of the lower stage 440.

Each push member 450 may include a joint 452, a load measurement unit 454, and a first actuator 456. The joint 452 may be connected to the lower stage 440. The joint 452 may adjust or set the levelness of (the upper surface of) the lower stage 440. For example, the joint 452 may be a ball joint.

The load measurement unit 454 measures the force exerted by the push member 450 during the boning process. To this end, the load measurement unit 454 may include a load cell. The load measurement unit 454 may be disposed between the joint 452 and the first actuator 456.

The first actuator 456 may move the joint 452 and the load measurement unit 454 vertically and hence, may also move the lower stage 440 toward the upper stage 430. The first actuator 456 may comprise an output shaft of a motor. The first actuators 456 may be independently driven.

Referring again to FIG. 12, the stage position monitoring part 460 for monitoring the position of the lower stage 440 may include a second actuator 462, a stage displacement sensor 464, a level gage 466, and a column 468. The second actuators 462 and the columns 468 may be disposed in pairs at opposite sides of the lower stage 440, respectively. The second actuator 462 may move the lower stage 440 in a direction in parallel to the upper stage 430. The stage displacement sensor 464 may detect the distance of the lower stage 440 from a reference position. The stage displacement sensor 464 may be disposed above a lower plate 422. The level gage 466 may detect a level of the lower stage 440. The level gage 466 may be fixed to a sidewall of the lower stage 440. The column 468 may be disposed on the lower plate 422 adjacent to the level gage 466. The column 468 may extend in a direction parallel to the push members 450, i.e., may extend vertically. The column 468 may provide a reference scale of the level gage 466. The column 468 may be fixed to the lower plate 422.

Figure 22:
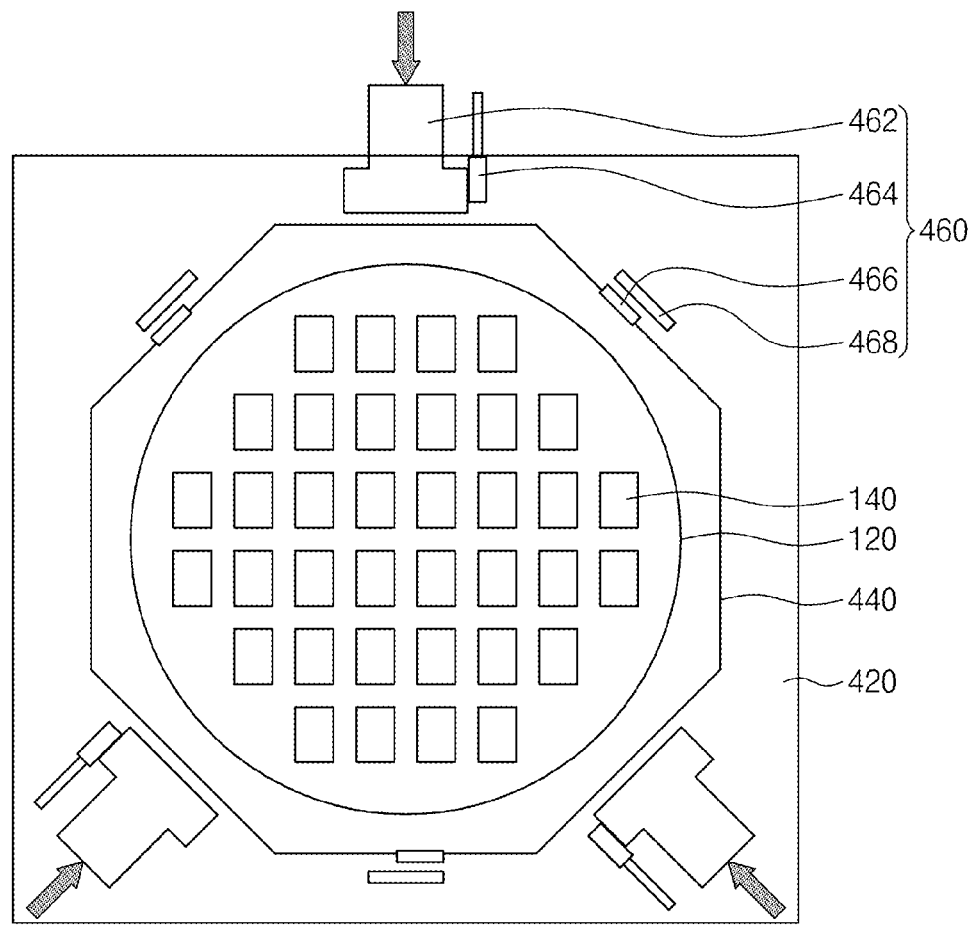
FIG. 22 is a plan view of the lower stage and the stage position monitoring part of the bonding apparatus.

FIG. 22 illustrates the lower stage 440 and stage position monitoring part 460. A plurality of second actuators 462 and columns 468 may be spaced a predetermined distance apart from each other along a circumference of the lower stage 440. The lower stage 440 may have a hexagonal shape. For example, three second actuators 462 may be disposed at an azimuth angle of about 120° with respect to the lower stage 440. The lower stage 440 may be disposed centrally of the second actuators 462. The second actuators 462 may move the lower stage 440 horizontally. Three columns 468 may be disposed at an azimuth angle of about 120° with respect to the lower stage 440. Each of three level gages 466 may output a signal indicative of a relative position or height of an edge of the lower stage 440. A control unit (not shown) may monitor a state of the lower stage 440, relative to the horizontal, according to a level detection signal of the level gage 466.

As described above, embodiments of bonding apparatus according to the inventive concept may include the upper and lower stages and a stage elevating (lifting/lowering) mechanism. The upper and lower stages may allow semiconductor chips to be bonded to the substrate in a gang bonding method. The semiconductor chips may be reliably bonded to the substrate and/or to one another by the elastic member and blocks of the upper stage.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments and examples described above but by the following claims.

What is claimed is:

1. A bonding apparatus comprising:
   an upper stage;
   a lower stage facing the upper stage and dedicated to support a stack of electronic components to be bonded; and
   an elevating mechanism that raises and lowers the lower stage relative to the upper stage to produce pressure for compressing a stack of components supported by the lower stage,
   wherein the upper stage comprises:
   a body having a bottom surface facing towards the lower stage;
   an elastic section at the bottom surface of the body; and
   an array of blocks supported by the elastic section and exposed at the bottom of the upper stage, whereby the blocks can contact and compress an array of components supported by the lower stage as the upper and lower stages are brought towards each other by the elevating mechanism, and
   wherein the elevating mechanism comprises:
   a joint connected to the lower stage;
   an actuator operatively connected to the lower stage and operable to raise and lower the lower stage; and
   a load sensor interposed between the actuator and the joint to detect a load applied to the lower stage in the vertical direction.

2. The bonding apparatus of claim 1, wherein the upper stage further comprises first bridges connecting the blocks to each other.

3. The bonding apparatus of claim 2, wherein the first bridges and the blocks are disposed at the bottom surface of the elastic member in a pattern of a mesh.

4. The bonding apparatus of claim 3, wherein the blocks are located at nodes of the mesh, the nodes being locations where the first bridges would otherwise intersect.

5. The bonding apparatus of claim 2, wherein each of the blocks is rectangular, and
   cross-shaped portions of the elastic member are delimited and exposed by the first bridges and the blocks.

6. The bonding apparatus of claim 2, wherein each of the first bridges comprises a flexible film.

7. The bonding apparatus of claim 2, wherein the upper stage comprises:
   a heating member disposed in the elastic member to heat upper ones of the electronic components stack on and supported by the lower stage; and
   second bridges connecting the first bridges to the heating member.

8. The bonding apparatus of claim 7, wherein each of the first bridges, the second bridges, and the blocks comprises a metal.

9. The bonding apparatus of claim 7, wherein the second bridges pass through the first bridges, and
the blocks have first sections disposed in the elastic member as interposed between the first bridges and the body, and second sections disposed on bottom surfaces of the first bridges and coupled to the first blocks.

10. The bonding apparatus of claim 1, further comprising a stage position monitor that controls a position of the lower stage,
wherein the stage position monitor comprises:
first actuators operatively connected to the lower stage to move the lower stage in a direction parallel to the bottom surface of the upper stage; and
position sensors disposed adjacent to the first actuators to sense a distance over which the lower stage has been moved by the first actuators.

11. The bonding apparatus of claim 10, wherein the stage position monitor further comprises:
level sensors disposed on a side of the lower stage and operative to detect a degree to which the upper surface of the lower stage is level; and
columns disposed laterally of the lower stage adjacent to the level sensors, respectively, and having reference scales for each of the level sensors.

12. A bonding apparatus comprising:
a frame;
an upper stage disposed within and supported by an upper portion of the frame;
a lower stage disposed within and supported by a lower portion of the frame, the lower stage dedicated to support a stack of electronic components to be bonded;
a jack disposed under the frame and connected to the lower stage to move the lower stage towards the upper stage such that a stack of components supported by the lower stage can be compressed by and between the upper and lower stages; and
a stage position monitor that controls a position of the lower stage,
wherein the upper stage comprises:
a body having a bottom surface facing towards the lower stage;
an elastic section at the bottom surface of the body; and
an array of blocks supported by the elastic section and exposed at a bottom of the upper stage, whereby the blocks can contact and compress an array of components supported by the lower stage as the lower stage is brought towards the upper stage by the jack, and
wherein the stage position monitor comprises:
level sensors disposed on a side of the lower stage and operative to detect a degree to which the upper surface of the lower stage is level; and
columns disposed laterally of the lower stage adjacent to the level sensors, respectively, and having reference scales for each of the level sensors.

13. The bonding apparatus of claim 12,
wherein the stage position monitor further comprises:
first actuators operatively connected to the lower stage to move the lower stage in a direction parallel to the bottom surface of the upper stage; and
position sensors disposed adjacent to the first actuators to sense a distance over which the lower stage has been moved by the first actuators.

14. Semiconductor device manufacturing equipment comprising:
a chip mounter that produces an unbonded stack of electronic components including chips disposed on a substrate, the chip mounter comprising a substrate support and a chip picker that sets chips in an array on a substrate supported by the substrate support;
a bonding apparatus that bonds the chips, the bonding apparatus comprising:
a lower stage,
an upper stage including a body having a bottom surface facing towards the lower stage, an elastic section at the bottom surface of the body, and an array of blocks supported by the elastic section and exposed at the bottom of the lower stage, and
an elevating mechanism that raises and lowers the lower stage relative to the upper stage,
wherein the elevating mechanism comprises:
a joint connected to the lower stage,
an actuator operatively connected to the lower stage and operable to raise and lower the lower stage, and
a load sensor interposed between the actuator and the joint to detect a load applied to the lower stage in the vertical direction; and
a transfer unit that transfers the unbonded stack of electronic components from the chip mounter to the lower stage of the bonding apparatus,
whereby the blocks of the bonding apparatus can contact the array of chips of an unbonded stack of electronic components supported by the lower stage and compress the stack with the lower stage as the upper and lower stages are brought towards each other by the elevating mechanism.

15. The manufacturing equipment as claimed in claim 14, wherein at least one of the stages of the bonding apparatus comprises a heater.

16. The manufacturing equipment as claimed in claim 14, wherein the elastic section is a pad of elastomeric material, and the blocks are of material that is more rigid than the elastomeric material.

17. The manufacturing equipment as claimed in claim 14, wherein the upper stage further comprises bridges of flexible material, discrete from the pad of elastomeric material, and connecting the blocks to each other.

18. The bonding apparatus of claim 17, wherein the upper stage further comprises:
a heating element of a heater disposed in the pad of elastomeric material; and
second bridges connecting the first bridges to the heating element.

19. The bonding apparatus of claim 14, wherein each of the blocks has an upper surface and side surfaces, and the pad continuously covers the upper surface and at least portions of the side surfaces of each of the blocks, whereby the blocks are embedded in the pad.

* * * * *